(12) United States Patent
Choi et al.

(10) Patent No.: US 9,324,538 B2
(45) Date of Patent: Apr. 26, 2016

(54) COAXIAL DRIVE APPARATUS FOR MULTIDIRECTIONAL CONTROL

(71) Applicant: KOREA BASIC SCIENCE INSTITUTE, Daejeon (KR)

(72) Inventors: Yeon Suk Choi, Daejeon (KR); Myung Su Kim, Daejeon (KR); Min-Gab Bog, Daejeon (KR); Jong-Su Jeon, Daejeon (KR); Jong-Gu Kim, Daejeon (KR)

(73) Assignee: KOREA BASIC SCIENCE INSTITUTE, Daejeon (KR)

( * ) Notice: Subject to any disclaimer, the term of this patent is extended or adjusted under 35 U.S.C. 154(b) by 387 days.

(21) Appl. No.: 14/107,083

(22) Filed: Dec. 16, 2013

(65) Prior Publication Data

US 2015/0143940 A1    May 28, 2015

(30) Foreign Application Priority Data

Nov. 27, 2013   (KR) .......................... 10-2013-0145394

(51) Int. Cl.
| | |
|---|---|
| *F16H 37/04* | (2006.01) |
| *H01J 37/20* | (2006.01) |
| *G02B 21/26* | (2006.01) |
| *F16H 37/14* | (2006.01) |
| *G02B 7/00* | (2006.01) |

(52) U.S. Cl.
CPC ................ *H01J 37/20* (2013.01); *G02B 21/26* (2013.01); *F16H 37/14* (2013.01); *G02B 7/004* (2013.01); *G02B 7/005* (2013.01); *H01J 2237/20214* (2013.01); *H01J 2237/20221* (2013.01); *Y10T 74/20213* (2015.01)

(58) Field of Classification Search
CPC ... Y10T 74/20213; F16H 37/14; G02B 7/004; H01J 37/20
See application file for complete search history.

(56) References Cited

U.S. PATENT DOCUMENTS

| | | | | | |
|---|---|---|---|---|---|
| 1,976,137 | A | * | 10/1934 | Nenninger | .............. B23C 1/025 409/170 |
| 2,027,385 | A | * | 1/1936 | Kraut | ...................... B23B 47/00 29/26 R |
| 2,271,817 | A | * | 2/1942 | Ernst | ..................... B24B 47/203 475/176 |
| 4,341,044 | A | * | 7/1982 | Cross | ........................ B24B 3/06 451/121 |
| 5,323,712 | A | * | 6/1994 | Kikuiri | ..................... B23Q 1/48 108/138 |
| 5,481,936 | A | * | 1/1996 | Yanagisawa | ............. B23Q 1/52 108/139 |
| 9,032,832 | B2 | * | 5/2015 | Wu | ........................ B25B 11/00 74/471 XY |
| 2002/0078779 | A1 | * | 6/2002 | Scheidegger | ........ B23Q 1/5487 74/490.08 |
| 2013/0087005 | A1 | * | 4/2013 | Van Lookeren Campagne | ............. A63G 31/16 74/490.08 |

FOREIGN PATENT DOCUMENTS

| | | | | |
|---|---|---|---|---|
| JP | 04034256 A | * | 2/1992 | ............. F16H 37/00 |
| KR | 10-2012-0118543 A | | 10/2012 | |
| KR | 10-1246677 B1 | | 3/2013 | |

* cited by examiner

*Primary Examiner* — David M Fenstermacher
(74) *Attorney, Agent, or Firm* — Maxon Law Group, PLLC.

(57) ABSTRACT

A coaxial drive apparatus for multidirectional control, including: a housing; a stage pivotally installed in the housing, with the object laid on the stage; a rotary shaft connected to the stage and rotated to cause the stage to pivot; a rotation transmitting unit transmitting a rotating force of the rotary shaft to the stage; a sliding pipe coaxially fitted over the rotary shaft so as to be moved along a lengthwise direction of the rotary shaft or to be rotated on a central axis of the rotary shaft; a moving unit moving the object laid on the stage in the lengthwise direction of the rotary shaft according to a movement of the sliding pipe, and moving the object in a transverse direction of the rotary shaft according to a rotation of the sliding pipe; and a controller providing a driving force to the rotary shaft and to the sliding pipe.

7 Claims, 7 Drawing Sheets

COAXIAL DRIVE APPARATUS FOR MULTIDIRECTIONAL CONTROL

CROSS REFERENCE RELATED APPLICATION

This application claims foreign priority of Korean Patent Application No. 2013-0145394, filed on Nov. 27, 2013, which is incorporated by reference in its entirety into this application.

BACKGROUND

1. Field of the Invention

The present invention relates, in general, to a coaxial drive apparatus for multidirectional control and, more particularly, to a coaxial drive apparatus for multidirectional control, which can control the moving direction of an object laid on a stage by rotating the object or by moving the object in a horizontal direction.

2. Description of the Related Art

A multidirectional control apparatus that can simultaneously perform a translation of an object in X- and Y-directions and a rotation of the object in a direction of θ is generally used to control the moving direction of an object laid on an inspection stage used to inspect semiconductor wafers, LCDs, etc. The multidirectional control apparatus is also used to variously control the measurement direction of a sample in an analysis system, such as a magnetic resonance system, a mass analyzer or an electron microscope.

As an example of conventional technologies relating to the present invention, Korean Patent No. 10-1242677 discloses a triaxial stage used in a high magnetic field measurement system with an extremely low temperature stage.

Figure 1:
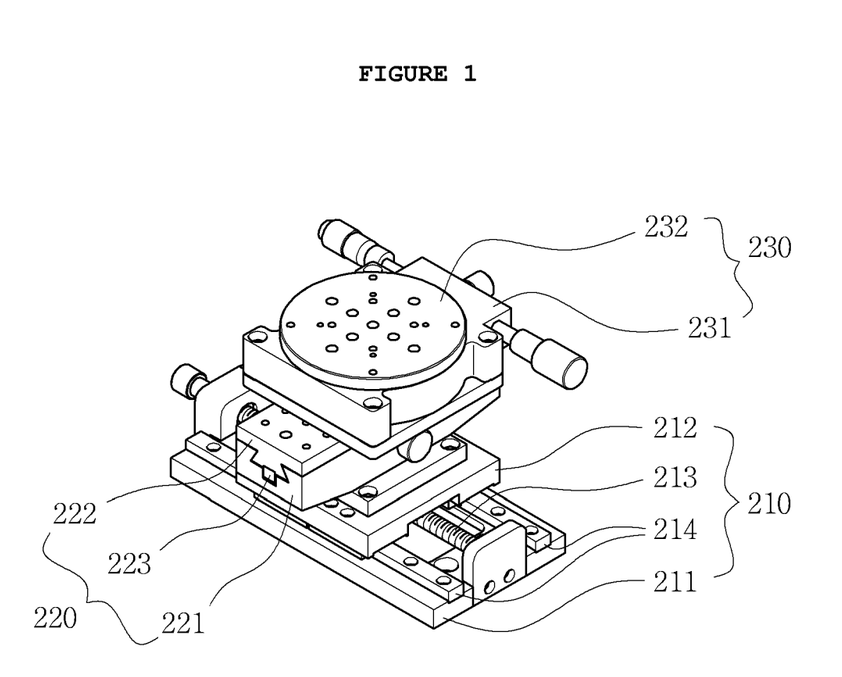
FIG. 1 is a perspective view illustrating a conventional triaxial stage.

As shown in FIG. 1, the conventional triaxial stage disclosed in Korean Patent No. 10-1242677 includes an X-axial moving unit 210 (211, 212, 213, 214) that moves in an X-axial direction, an Y-axial moving unit 220 (221, 222, 223) that moves in an Y-axial direction, and a rotary unit 230 (231, 232) that is configured to be rotated, so the triaxial stage can move an extremely low temperature stage (not shown) laid thereon in triaxial directions.

However, as shown in FIG. 1, the conventional triaxial stage is problematic in that the X-axial moving unit 210, the Y-axial moving unit 220 and the rotary unit 230 are laid on top of each other, so the triaxial stage has a large volume and the space for installing the triaxial stage is limited. Further, the drive shafts of the respective units 210, 220 and 230 are directed in different directions, so the triaxial stage limits the control space and control direction of an operator.

As another example of conventional technologies relating to the present invention, Korean Patent Application Publication No. 10-2012-0118543 discloses a microscopically drivable, high precision triaxial stage. This triaxial stage is also problematic in that respective units constituting the stage are laid on top of each other, so the triaxial stage may not be installed in a limited space of a small-sized system.

The foregoing is intended merely to aid in the understanding of the background of the present invention, and is not intended to mean that the present invention falls within the purview of the related art that is already known to those skilled in the art.

DOCUMENTS OF RELATED ART (Patent Document 1) Korean Patent No. 10-1242677;
(Patent Document 2) Korean Patent Application Publication No. 10-2012-0118543.

SUMMARY

Accordingly, the present invention has been made keeping in mind the above problems occurring in the related art, and the present invention is intended to propose a coaxial drive apparatus for multidirectional control, which can pivot-rotate and horizontally move an object laid on a stage by driving the stage on a coaxial drive shaft, thereby realizing smallness of the apparatus.

In order to achieve the above object, according to one aspect of the present invention, there is provided a coaxial drive apparatus for multidirectional control, which controls at least one of a movement and a rotation of an object, the apparatus including: a housing; a stage pivotally installed in the housing, with the object laid on the stage; a rotary shaft connected to the stage and rotated to cause the stage to pivot; a rotation transmitting unit transmitting a rotating force of the rotary shaft to the stage; a sliding pipe coaxially fitted over the rotary shaft such that the sliding pipe is moved along a lengthwise direction of the rotary shaft or is rotated on a central axis of the rotary shaft; a moving unit moving the object laid on the stage in the lengthwise direction of the rotary shaft according to a lengthwise directional movement of the sliding pipe, and moving the object in a transverse direction of the rotary shaft according to a rotation of the sliding pipe; and a controller providing a driving force to the rotary shaft and to the sliding pipe.

The rotation transmitting unit may include: a rotary shaft pinion gear integrated with an end of the rotary shaft, thereby being rotated by a rotation of the rotary shaft; and a ring gear integrated with an edge of the stage and engaged with the rotary shaft pinion gear in a perpendicular engagement state.

The moving unit may include: a slider movably combined with the housing and horizontally moved at a location above an upper surface of the stage, with a receiving hole formed through the slider such that the receiving hole communicates with the stage, so the receiving hole receives an edge of the object therein, and the slider moves the object by an inner circumferential surface of the receiving hole when the slider is moved by the sliding pipe; and a slider connector connecting the slider to the sliding pipe such that the slider moves in the lengthwise direction and in the transverse direction of the rotary shaft.

The slider connector may include: a connector pinion gear integrated with an end of the sliding pipe such that the connector pinion gear is rotated along with the sliding pipe; a rack gear integrated with the slider such that the rack gear is engaged with the connector pinion gear and horizontally moves the slider in the transverse direction of the rotary shaft according to a rotation of the connector pinion gear; and a gear holder integrated with the slider, the gear holder rotatably receiving the connector pinion gear therein and engaged with opposite ends of the connector pinion gear according to the lengthwise directional movement of the sliding pipe, thereby horizontally moving the slider in the lengthwise direction of the rotary shaft.

The moving unit may include: a guider provided in the housing, the guider guiding a horizontal movement of the slider and elastically biasing the slider so as to absorb shock of the slider.

The guider may include: a guide block movably installed in the housing, with a guide groove formed in the guide block so as to receive a part of the slider therein, so the guide block guides the slider by the guide groove; and an elastic body elastically biasing the guide block, thereby absorbing shock of the slider.

The stage may include: a cylindrical stage body, with the object seated on an upper surface of the stage body; and a rotary ball installed in the housing and pivotally supporting a lower center of the stage body thereon.

The coaxial drive apparatus for multidirectional control according to the present invention is advantageous in that a rotary shaft functioning to pivot-rotate a stage and a sliding pipe functioning to horizontally move an object are combined with each other by a coaxial shaft so as to be driven by the coaxial shaft, so a controller placed in a side of the apparatus can efficiently control the moving direction of the object, and the apparatus can realize smallness. Accordingly, the coaxial drive apparatus can be efficiently used in a high precision measurement system, such as an electron microscope or a magnetic resonance system, having a limited space in which the coaxial drive apparatus is installed.

Further, in the coaxial drive apparatus, a rotation transmitting unit comprises a rotary shaft pinion gear and a ring gear which are engaged with each other, so the stage can be connected to the rotary shaft in a perpendicular engagement state.

Further, a slider that functions to move the object is connected to the sliding pipe by both a rack gear and a connector pinion gear, and is engaged with the connector pinion gear by a gear holder, so the object can be efficiently moved in a lengthwise direction or in a transverse direction of the sliding pipe by a rotation or a movement of the sliding pipe.

Further, the slider is guided by a guide block and is elastically biased by an elastic body, so the object can be more efficiently moved.

In addition, a stage body constituting the stage is combined with a housing by a rotary ball, so the stage body can efficiently pivot on the rotary ball according to a rotation of the rotary shaft.

BRIEF DESCRIPTION

The above and other objects, features and other advantages of the present invention will be more clearly understood from the following detailed description when taken in conjunction with the accompanying drawings, in which.

DETAILED DESCRIPTION

Hereinbelow, preferred embodiments of the present invention will be described in detail with reference to the accompanying drawings. In the following description, a detailed explanation of functions and constructions well known in the art will be omitted.

Figure 2:
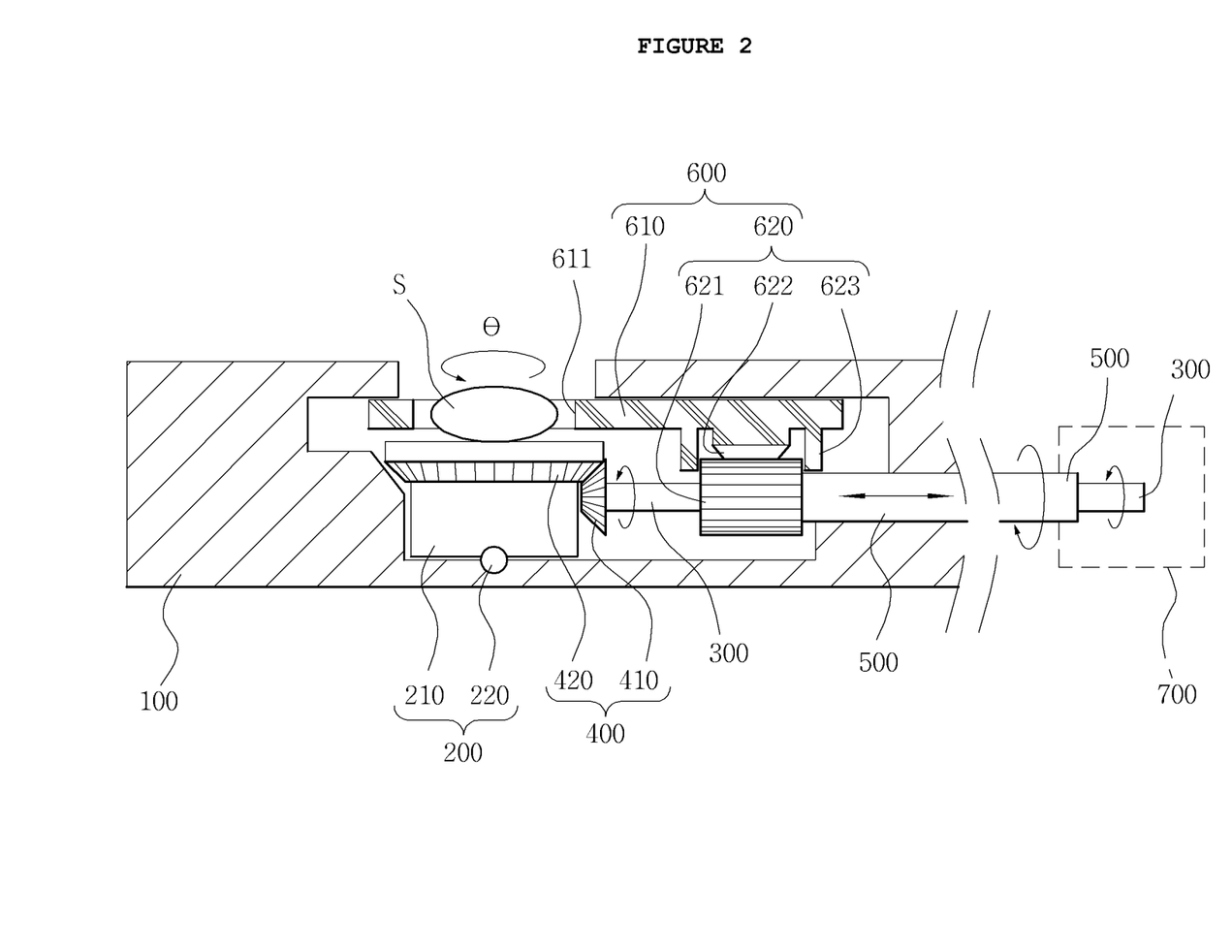
FIG. 2 is a view illustrating the construction of a coaxial drive apparatus for multidirectional control according to the present invention.

As shown in FIG. 2, a coaxial drive apparatus for multidirectional control according to the present invention includes a housing 100, a stage 200, a rotary shaft 300, a rotation transmitting unit 400, a sliding pipe 500, a moving unit 600 and a controller 700.

The housing 100 is a part which forms a shape of the apparatus and in which parts are installed as will be described later herein.

The detailed shape and structure of the housing 100 may be variously changed according to fields to which the apparatus of the present invention is used. For example, the housing 100 may be formed as a bar-shaped housing having a predetermined length.

The stage 200 is a part on which an object S to be direction-controlled is laid. As shown in FIG. 2, the stage 200 may be installed in the housing 100 is such a way that the stage 200 can pivot in the housing 100.

Figure 3:
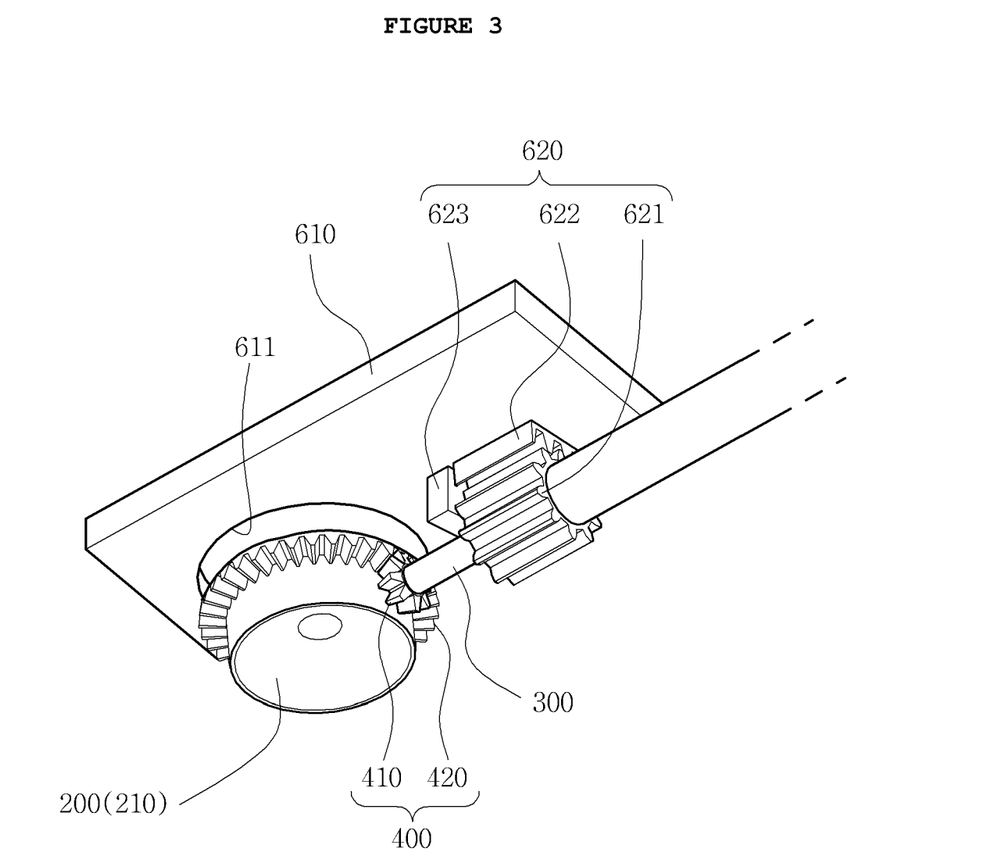
FIG. 3 is a bottom perspective view illustrating both a stage and a rotary shaft shown in FIG. 2.

For example, the stage 200 may comprise a stage body 210 and a rotary ball 220, as shown in FIGS. 2 and 3.

As shown in FIG. 3, the stage body 210 is a cylindrical body. Here, an object S is seated on the upper surface of the stage body 210, as shown in FIG. 2.

As shown in FIG. 2, the rotary ball 220 is installed in the housing 100 and functions as a pivot point on which the lower center of the stage body 210 is supported so as to pivot on the pivot point.

In other words, the stage body 210 can pivot on the rotary ball 220.

Unlike the above-mentioned construction, the stage 200 may be formed as a circular disc shape and may be combined with the housing 100 by another rotary member, such as a bearing, so as to pivot on the rotary member.

The rotary shaft 300 is a part that pivot-rotates the stage 200, thereby moving the object S laid on the stage 200 in a direction of θ.

As shown in FIG. 2, the rotary shaft 300 is formed as a bar- or pipe-shaped member having a predetermined length, and is rotatably installed in the housing 100, and is rotated by a driving force applied thereto from the controller 700.

The rotation transmitting unit 400 is a part that transmits the rotating force of the rotary shaft 300 which is formed by the controller 700 to the stage 200, and rotates the stage 200.

For example, as shown in FIGS. 2 and 3, the rotation transmitting unit 400 may include a rotary shaft pinion gear 410 and a ring gear 420.

As shown in the drawings, the rotary shaft pinion gear 410 is integrated with an end of the rotary shaft 300 into a single body, thereby being rotated by a rotation of the rotary shaft 300.

As shown in FIG. 3, the ring gear 420 is integrated with the lower edge of the stage 200 into a single body, and is engaged with the rotary shaft pinion gear 410 in a perpendicular engagement state.

In other words, the ring gear 420 and the rotary shaft pinion gear 410 form a pair of bevel gears, and transmit the rotating force of the rotary shaft 300 to the stage 200 in the perpendicular engagement state.

Figure 4:
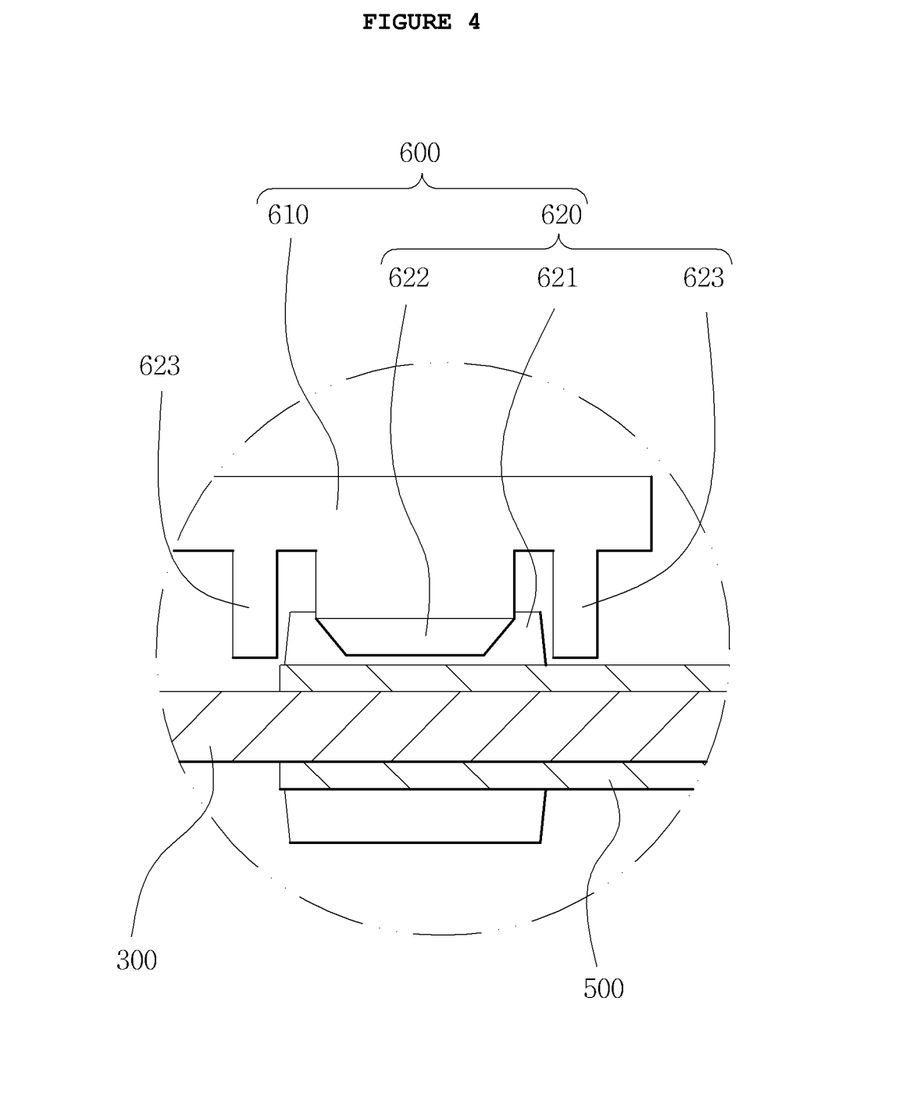
FIG. 4 is an enlarged perspective view illustrating an engagement relationship between the rotary shaft and a sliding pipe shown in FIG. 2.
Figure 5:
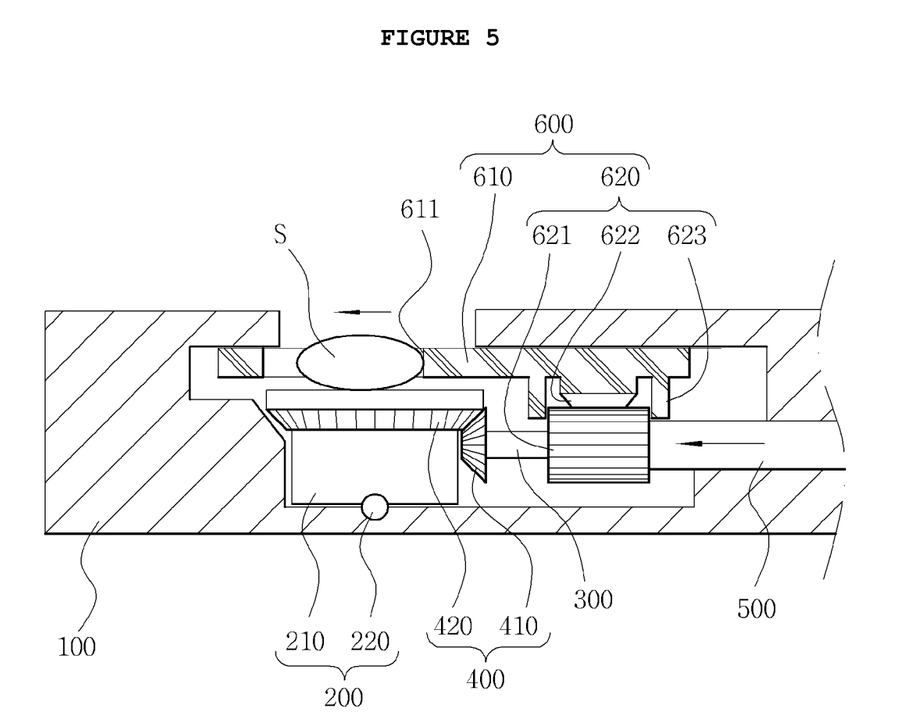
FIG. 5 is a view illustrating a lengthwise directional movement of a slider according to an axial movement of the sliding pipe.

The sliding pipe 500 is a part that is coaxially fitted over the rotary shaft 300, as shown in FIG. 4, and is moved along a lengthwise direction of the rotary shaft 300 or is rotated on the central axis of the rotary shaft 300, as shown in FIG. 5.

The sliding pipe 500 is formed as a tubular member having a predetermined length, and is movably fitted over the rotary shaft 300. As shown in FIG. 2, the sliding pipe 500 is connected to the controller 700, and is rotated on the central axis of the rotary shaft 300 or is axially moved, thereby moving the object S by the moving unit 600 in an X-axial direction or in an Y-axial direction.

The moving unit 600 is a part that functions to move the object S in the lengthwise direction of the rotary shaft 300 which is the X-axial direction according to an axial movement of the sliding pipe 500, and to move the object S in a transverse direction of the rotary shaft 300 which is the Y-axial direction according to a rotation of the sliding pipe 500.

For example, as shown in FIGS. 3 and 4, the moving unit 600 may comprise a slider 610 and a slider connector 620.

As shown in FIG. 2, the slider 610 is movably combined with the housing 100 and is horizontally moved at a location above the upper surface of the stage 200.

Figure 6:
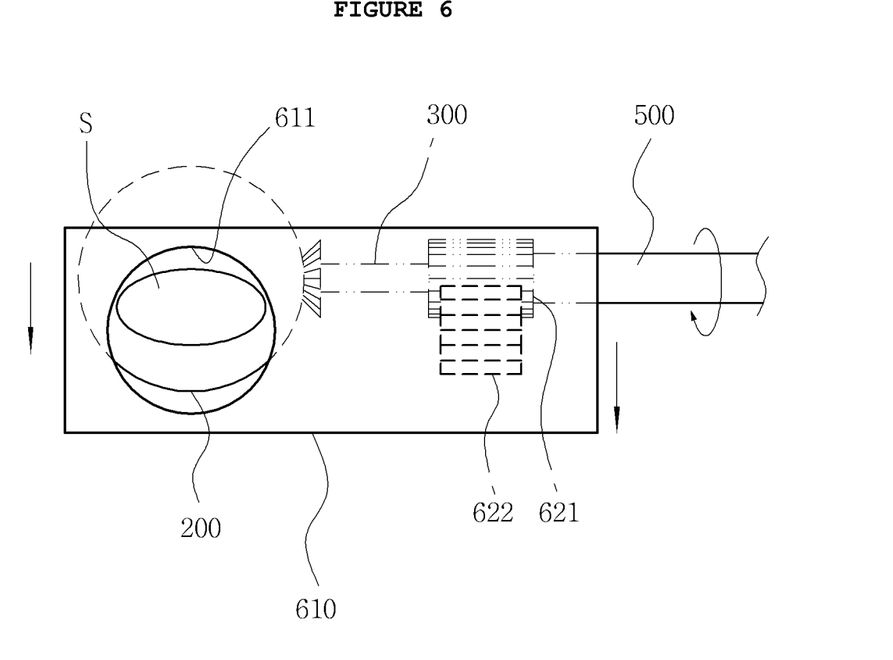
FIG. 6 is a view illustrating a transverse directional movement of the slider according to a rotation of the sliding pipe.

Here, as shown in FIG. 6, a receiving hole 611 is formed through the slider 610 such that the receiving hole 611 communicates with the stage 200, so the receiving hole 611 receives the edge of the object S therein. When the slider 610 is moved in a horizontal direction, the object S is moved under the guide of the inner circumferential surface of the receiving hole 611.

The slider connector 620 is a part that connects the slider 610 to the sliding pipe 500, and horizontally moves the slider 610 according to the operation of the sliding pipe 500.

For example, as shown in FIGS. 3 and 4, the slider connector 620 may comprise a connector pinion gear 621, a rack gear 622 and a gear holder 623.

As shown in FIGS. 3 and 4, the connector pinion gear 621 may be integrated with an end of the sliding pipe 500 such that the connector pinion gear 621 can be moved along the lengthwise direction of the rotary shaft 300 while being rotated along with the sliding pipe 500.

As shown in FIGS. 3 and 4, the rack gear 622 may be integrated with the lower surface of the slider 610 such that the rack gear 622 can be engaged with the connector pinion gear 621 and can move the slider 610 in a horizontal direction according to a rotation of the connector pinion gear 621.

In other words, as shown in FIG. 6, the slider 610 is moved in a direction crossing the rotary shaft 300 both by the connector pinion gear 621 and by the rack gear 622 according to a rotation of the sliding pipe 500, so the slider 610 can move the object S by the inner circumferential surface of the receiving hole 611.

As shown in FIGS. 3 and 4, two gear holders 623 protrude downward from the lower surface of the slider 610, and rotatably receive the connector pinion gear 621 between them. Here, the gear holders 623 can be engaged with opposite ends of the connector pinion gear 621 according to an axial movement of the sliding pipe 500, thereby moving the slider 610 in a horizontal direction.

In other words, as shown in FIG. 5, when the sliding pipe 500 is moved along the lengthwise direction of the rotary shaft 300, the slider 610 is caught by the end of the connector pinion gear 621 and is pushed by the connector pinion gear 621, thus being moved along the lengthwise direction of the rotary shaft 300. In the above state, due to the movement of the slider 610, the object S is moved by the inner circumferential surface of the receiving hole 611.

Here, although it is preferred that the two gear holders 623 protrude downward such that the gear holders 623 face the opposite ends of the connector pinion gear 621, as shown in FIGS. 4 and 5, one of the two gear holders 623 is shown in FIG. 3 so as to illustrate the shape of the rack gear 622.

Figure 7:
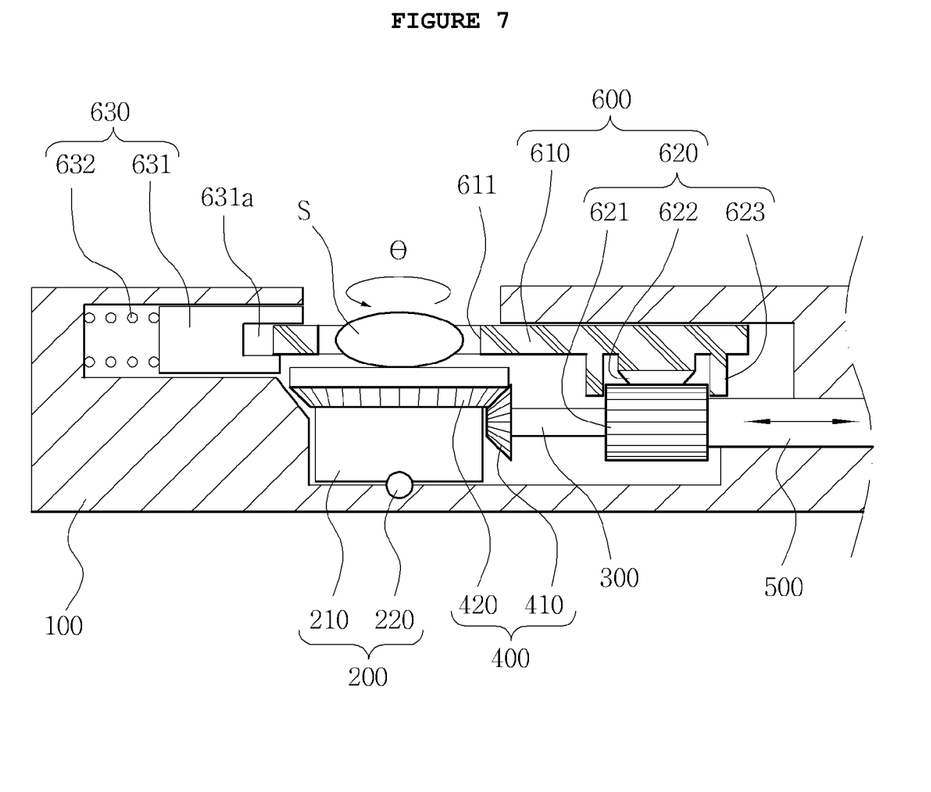
FIG. 7 is a sectional view illustrating a guider according to the present invention.

Further, the moving unit 600 may further comprise a guider 630, as shown in FIG. 7.

The guider 630 is a part that guides a horizontal movement of the slider 610 which is moved by the operation of the sliding pipe 500. The guider 630 also elastically biases the slider 610, thereby preventing the slider 610 from being excessively moved while absorbing shock of the slider 610. For example, as shown in FIG. 7, the guider 630 may comprise a guide block 631 and an elastic body 632.

As shown in FIG. 7, the guide block 631 is movably installed in the housing 100, with a guide groove 631a formed in the guide block 631 so as to receive a part of the slider 610 therein, so the slider 610 can be guided along the guide groove 631a.

As shown in FIG. 7, the elastic body 632 elastically biases the guide block 631 and absorbs shock that may be generated when the slider 610 is excessively moved.

In other words, the slider 610 is guided along the guide groove 631a of the guide block 631, so the slider 610 can be moved in a stable state. Further, shock which may be generated when the slider 610 is excessively moved can be efficiently absorbed by the elastic body 631, so the object S can be maintained in a safe state.

Here, the elastic body 632 may be formed as a coil spring. Alternatively, the elastic body 632 may be formed as a plate spring or an air spring.

Further, a guide slot or a guide rail that is formed in the housing 100 may be used instead of the guide block 631 of the guider 630.

As shown in FIG. 2, the controller 700 is connected both to the rotary shaft 300 and to the sliding pipe 500, and providing the driving force to the rotary shaft 300 and to the sliding pipe 500.

Here, the controller 700 is located in one side of the apparatus and efficiently controls the operation of both the rotary shaft 300 and the sliding pipe 500, so the controller 700 can more efficiently control the operation of the apparatus and can realize the simple construction of the apparatus.

Here, the controller 700 may comprise a typical drive member, such as a drive motor, that can rotate both the rotary shaft 300 and the sliding pipe 500, and can move the rotary shaft 300 in the lengthwise direction of the rotary shaft 300.

Hereinbelow, the operation of the present invention having the above-mentioned construction will be described.

The object S is laid on the upper surface of the stage body 210.

When it is required to pivot-rotate the object S, the rotary shaft 300 is rotated by the controller 700, and rotates the stage body 210 by transmitting the rotating force to the stage body 210 by the engagement of the rotary shaft pinion gear 410 with the ring gear 420, so the stage body 210 pivots on the center of the rotary ball 220 and rotates the object S in a direction of θ.

When it is required to move the object S in the lengthwise direction of the rotary shaft 300 which is the X-axial direction, the sliding pipe 500 is moved along the rotary shaft 300 by the controller 700, so the connector pinion gear 621 is axially moved in the same direction along with the sliding pipe 500. Accordingly, the slider 610 is moved by the gear holders 623 that are engaged with the connector pinion gear 621, so the object S is pushed in the X-axial direction by the inner circumferential surface of the receiving hole 611.

When it is required to move the object S in a transverse direction of the rotary shaft 300 which is the Y-axial direction, the sliding pipe 500 is rotated by the controller 700, so the connector pinion gear 621 is rotated in the same direction along with the sliding pipe 500. Accordingly, the slider 610 is moved in the Y-axial direction by the rack gear 622, so the object S is pushed in the Y-axial direction by the inner circumferential surface of the receiving hole 611.

As described above, the coaxial drive apparatus for multi-directional control according to the present invention is advantageous in that the rotary shaft 300 functioning to pivot-rotate the stage 200 and the sliding pipe 500 functioning to horizontally moving the object S are combined with each other on a coaxial shaft so as to be driven on the coaxial shaft, so the controller 700 placed in a side of the apparatus can efficiently control the moving direction of the object S, and the apparatus can realize smallness. Accordingly, the coaxial drive apparatus of the present invention can be efficiently used in a high precision measurement system, such as an electron microscope or a magnetic resonance system, having a limited space in which the coaxial drive apparatus is installed.

Further, in the coaxial drive apparatus, the rotation transmitting unit 400 comprises the rotary shaft pinion gear 410 and the ring gear 420 which are engaged with each other, so the stage 200 can be connected to the rotary shaft 300 in a perpendicular engagement state.

Further, the slider 610 that functions to move the object S is connected to the sliding pipe 500 by both the rack gear 622 and the connector pinion gear 621, and is engaged with the connector pinion gear 621 by the gear holders 623, so the object S can be efficiently moved in the lengthwise direction or in the transverse direction of the sliding pipe 500 by a rotation or a movement of the sliding pipe 500.

Further, the slider 610 is guided by the guide block 631 and is elastically biased by the elastic body 632, so the object S can be more efficiently moved.

In addition, the stage body 210 constituting the stage 200 is combined with the housing 100 by the rotary ball 220, so the stage body 210 can efficiently pivot on the rotary ball 220 according to a rotation of the rotary shaft 300.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A coaxial drive apparatus for multidirectional control, which controls at least one of a movement and a rotation of an object, the apparatus comprising:
    a housing;
    a stage pivotally installed in the housing, with the object laid on the stage;
    a rotary shaft connected to the stage and rotated to cause the stage to pivot;
    a rotation transmitting unit transmitting a rotating force of the rotary shaft to the stage;
    a sliding pipe coaxially fitted over the rotary shaft such that the sliding pipe is moved along a lengthwise direction of the rotary shaft or is rotated on a central axis of the rotary shaft;
    a moving unit moving the object laid on the stage in the lengthwise direction of the rotary shaft according to a lengthwise directional movement of the sliding pipe, and moving the object in a transverse direction of the rotary shaft according to a rotation of the sliding pipe; and
    a controller providing a driving force to the rotary shaft and to the sliding pipe.

2. The coaxial drive apparatus for multidirectional control as set forth in claim 1, wherein the rotation transmitting unit comprises:
    a rotary shaft pinion gear integrated with an end of the rotary shaft, thereby being rotated by a rotation of the rotary shaft; and
    a ring gear integrated with an edge of the stage and engaged with the rotary shaft pinion gear in a perpendicular engagement state.

3. The coaxial drive apparatus for multidirectional control as set forth in claim 1, wherein the moving unit comprises:
    a slider movably combined with the housing and horizontally moved at a location above an upper surface of the stage, with a receiving hole formed through the slider such that the receiving hole communicates with the stage, so the receiving hole receives an edge of the object therein, and the slider moves the object by an inner circumferential surface of the receiving hole when the slider is moved by the sliding pipe; and
    a slider connector connecting the slider to the sliding pipe such that the slider moves in the lengthwise direction and in the transverse direction of the rotary shaft.

4. The coaxial drive apparatus for multidirectional control as set forth in claim 3, wherein the slider connector comprises:
    a connector pinion gear integrated with an end of the sliding pipe such that the connector pinion gear is rotated along with the sliding pipe;
    a rack gear integrated with the slider such that the rack gear is engaged with the connector pinion gear and horizontally moves the slider in the transverse direction of the rotary shaft according to a rotation of the connector pinion gear; and
    a gear holder integrated with the slider, the gear holder rotatably receiving the connector pinion gear therein and engaged with opposite ends of the connector pinion gear according to the lengthwise directional movement of the sliding pipe, thereby horizontally moving the slider in the lengthwise direction of the rotary shaft.

5. The coaxial drive apparatus for multidirectional control as set forth in claim 3, wherein the moving unit comprises:
    a guider provided in the housing, the guider guiding a horizontal movement of the slider and elastically biasing the slider so as to absorb shock of the slider.

6. The coaxial drive apparatus for multidirectional control as set forth in claim 5, wherein the guider comprises:
    a guide block movably installed in the housing, with a guide groove formed in the guide block so as to receive a part of the slider therein, so the guide block guides the slider by the guide groove; and
    an elastic body elastically biasing the guide block, thereby absorbing shock of the slider.

7. The coaxial drive apparatus for multidirectional control as set forth in claim 5, wherein the stage comprises:
    a cylindrical stage body, with the object seated on an upper surface of the stage body; and
    a rotary ball installed in the housing and pivotally supporting a lower center of the stage body thereon.

* * * * *